(12) United States Patent
Roy et al.

(10) Patent No.: US 8,773,924 B2
(45) Date of Patent: Jul. 8, 2014

(54) READ ASSIST SCHEME FOR REDUCING READ ACCESS TIME IN A MEMORY

(71) Applicant: LSI Corporation, Milpitas, CA (US)

(72) Inventors: Uddip Roy, Agartala (IN); Vinod Rachamadugu, Kurnool (IN); Vamsi Krishna Grandhi, Chilakaluripet (IN); Setti Shanmukheswara Rao, Bangalore (IN)

(73) Assignee: LSI Corporation, San Jose, CA (US)

( * ) Notice: Subject to any disclaimer, the term of this patent is extended or adjusted under 35 U.S.C. 154(b) by 79 days.

(21) Appl. No.: 13/706,276

(22) Filed: Dec. 5, 2012

(65) Prior Publication Data

US 2014/0153346 A1    Jun. 5, 2014

(51) Int. Cl.
*G11C 7/12* (2006.01)
*G11C 7/10* (2006.01)

(52) U.S. Cl.
CPC ................................ *G11C 7/12* (2013.01); *G11C 7/1048* (2013.01)
USPC ....... 365/189.15; 365/154; 365/194; 365/203

(58) Field of Classification Search
CPC ................................ G11C 7/12; G11C 7/1048
USPC ...................... 365/189.15, 154, 194, 203, 204
See application file for complete search history.

(56) References Cited

U.S. PATENT DOCUMENTS

| | | | | |
|---|---|---|---|---|
| 5,313,434 A | * | 5/1994 | Abe | 365/233.5 |
| 5,539,700 A | * | 7/1996 | Kawahara et al. | 365/203 |
| 6,212,120 B1 | * | 4/2001 | Nakamura et al. | 365/227 |
| 7,499,312 B2 | * | 3/2009 | Matick et al. | 365/154 |
| 2004/0141362 A1 | * | 7/2004 | Sumitani et al. | 365/154 |
| 2009/0067223 A1 | * | 3/2009 | Chuang et al. | 365/156 |

* cited by examiner

*Primary Examiner* — Tan T. Nguyen
(74) *Attorney, Agent, or Firm* — Otterstedt, Ellenbogen & Kammer, LLP

(57) ABSTRACT

A read circuit includes a precharge circuit, coupled with at least a subset of bit lines and a sense circuit in a memory, and a transmission gate. The precharge circuit receives a first control signal and is operative during a first mode to set the bit lines to a first voltage level and to set an input to the sense circuit to a second voltage level. The transmission gate connects a given one of the bit lines with the sense circuit during a second mode as a function of a second control signal, such that when reading a first logic level from the selected memory cell, when the input of the sense circuit is connected with the given bit line, the given bit line is discharged to at least a third voltage, which is between the first and second voltage levels, thereby reducing a read access time in the memory.

22 Claims, 5 Drawing Sheets

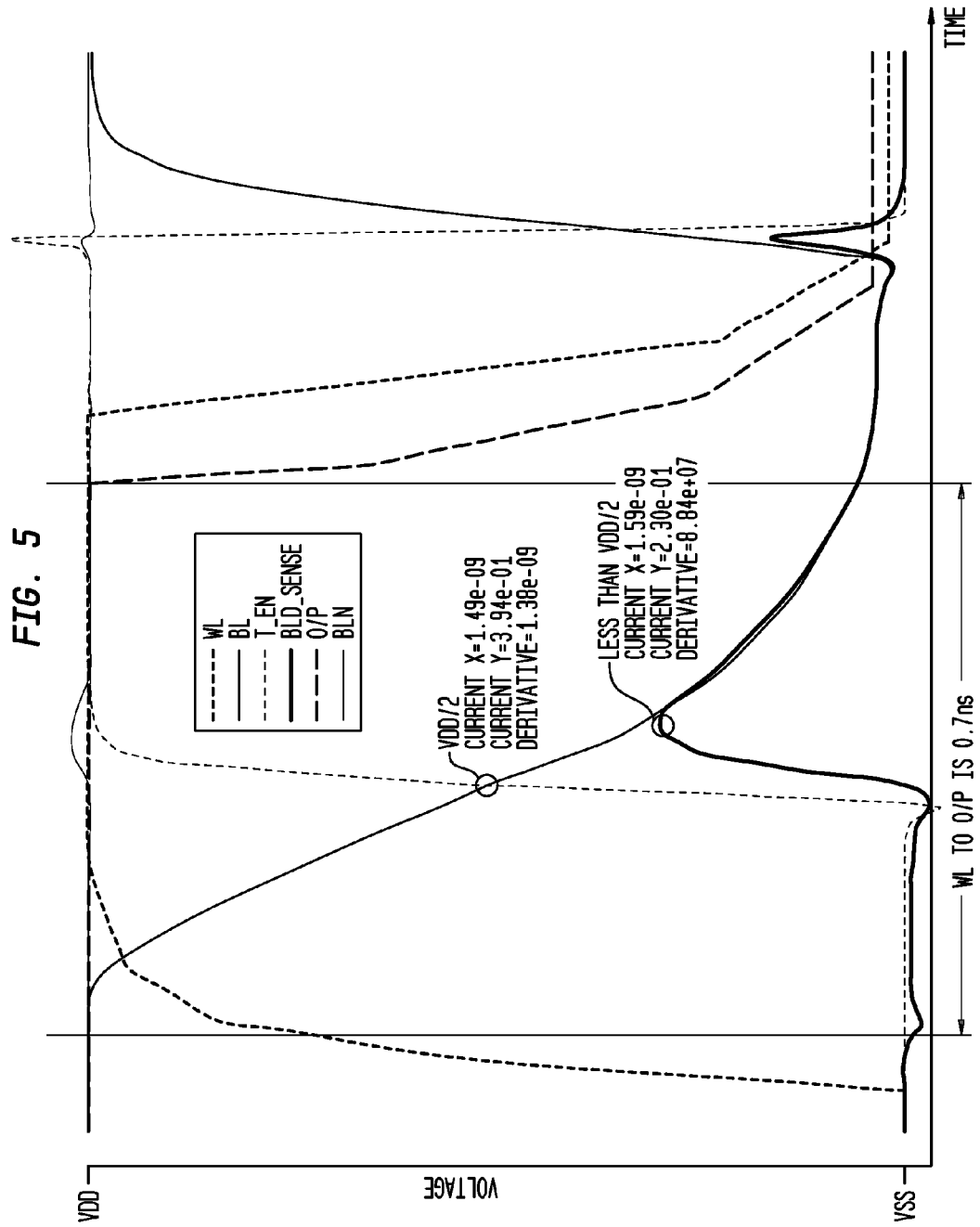

READ ASSIST SCHEME FOR REDUCING READ ACCESS TIME IN A MEMORY

BACKGROUND

Many modern high-speed memories, including, but not limited to, caches, register files, port buffer memories, content addressable memories (CAMs), etc., demand single-port and multi-port static random access memories (SRAMs) with fast access times. There are several known circuits and architectural techniques for speeding up a read data path in the memory/register file with a capability to speed up data flow through logic circuitry in the memory/register file. Read access time is often determined as a sum of the time to assert an enable signal on a selected word line ($t_{WL}$), the time to discharge a corresponding bit line ($t_{BL\_DIS}$), the time to sense a bit line signal developed on the bit line ($t_{SEN}$), and the time to transfer data indicative of the sensed bit line signal to a read output port of the memory ($t_{TRANS}$). Read access time is a critical timing parameter that limits the cycle time of the memories.

SUMMARY

Embodiments of the present invention provide techniques for sensing data in a memory (e.g., embedded or standalone) in such a manner that read access time is advantageously reduced. In this regard, embodiments of the invention provide a read assist scheme that beneficially reduces memory cycle time in a variety of memory arrangements and types, such as, for example, random access memory (RAM), static random access memory (SRAM), read-only memory (ROM), content addressable memory (CAM), flash memory, caches, register files, port buffer memories, and the like.

In accordance with an embodiment of the invention, a read circuit is provided for use in a memory including a plurality of memory cells, at least one word line and a plurality of bit lines coupled with the memory cells for selectively accessing the memory cells, and at least one sense circuit for reading data stored in a selected one of the memory cells. The read circuit includes a precharge circuit, coupled with at least a subset of the bit lines and the sense circuit, and a transmission gate. The precharge circuit is operative to receive at least a first control signal, and is operative during a first mode to set the bit lines to a first voltage level and to set an input to the sense circuit to a second voltage level. The transmission gate is operative to selectively connect a given one of the bit lines with the sense circuit during a second mode as a function of at least a second control signal. The second control signal is a delayed version of the first control signal, such that when reading a first logic level from the selected one of the memory cells, when the input of the sense circuit is connected with the given one of the bit lines, the given one of the bit lines is discharged to at least a third voltage, the third voltage being between the first and second voltage levels, thereby reducing a read access time in the memory.

In accordance with another embodiment of the invention, a memory circuit includes a plurality of memory cells, at least one word line and a plurality of bit lines, the word line and bit lines being coupled with the memory cells for selectively accessing the memory cells, and at least one sense circuit operative to read data stored in a selected one of the memory cells. A controller included in the memory circuit is operative to receive, as input control signals, an address signal and a data signal, and to generate a plurality of output control signals for accessing one or more of the memory cells as a function of the input control signals. The memory circuit further includes a read circuit. The read circuit comprises a precharge circuit coupled with at least a subset of the bit lines and the sense circuit, the precharge circuit being operative to receive at least a first control signal, and being operative during a first mode to set the bit lines to a first voltage level and to set an input to the sense circuit to a second voltage level. The read circuit further includes a transmission gate operative to selectively connect a given one of the bit lines with the sense circuit during a second mode as a function of at least a second control signal. The second control signal is a delayed version of the first control signal, such that when reading a first logic level from the selected memory cell, when the input of the sense circuit is connected with the given one of the bit lines, the given one of the bit lines is discharged to at least a third voltage, the third voltage being between the first and second voltage levels, thereby reducing a read access time in the memory circuit.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 5 is a graphical view depicting exemplary waveforms of certain signals in the illustrative memory circuit shown in FIG. 4 during a read "0" operation.

Figure 1:
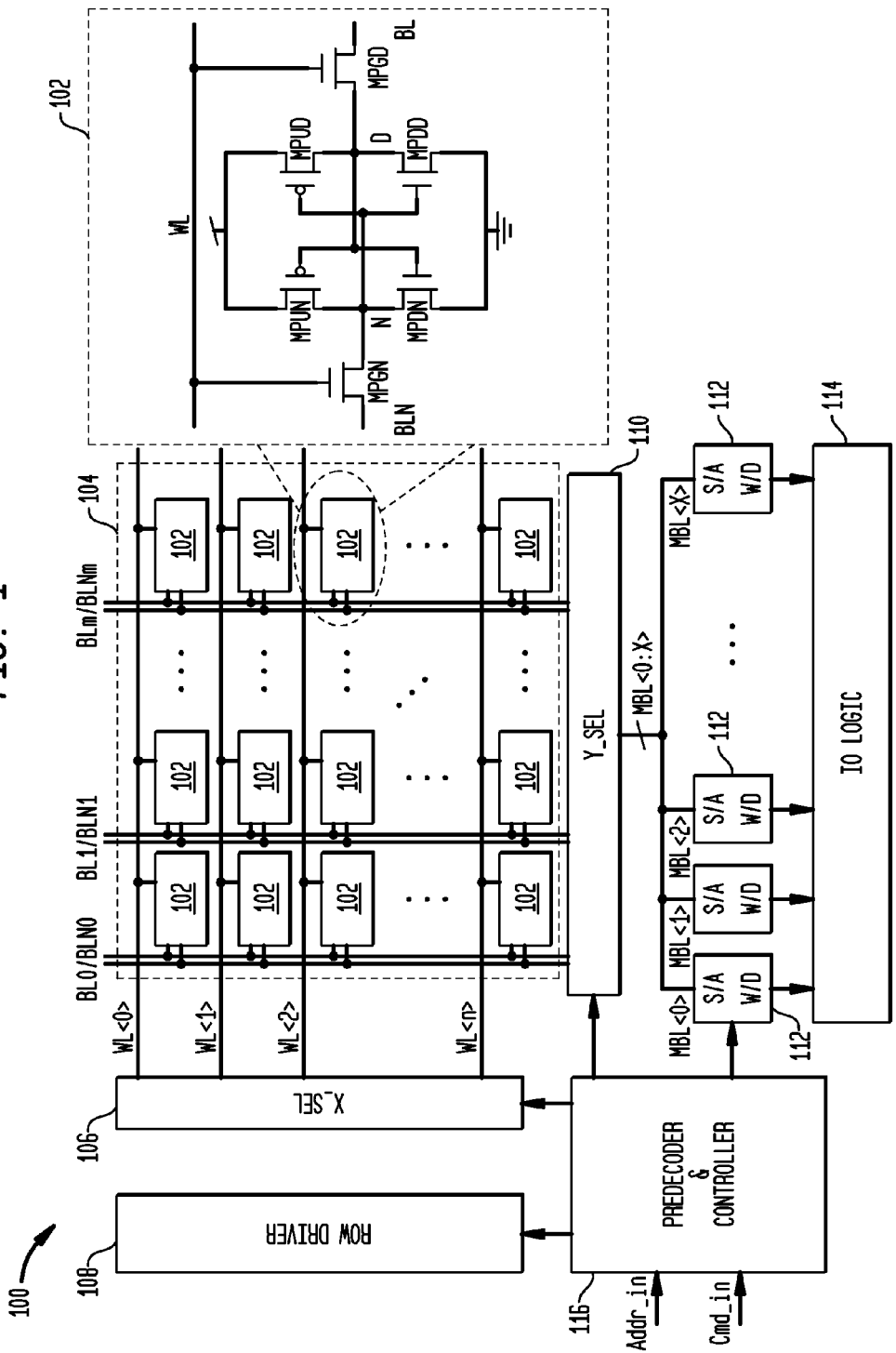
FIG. 1 is a block diagram illustrating at least a portion of an exemplary memory circuit in which embodiments of the invention can be implemented.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative read circuits for advantageously improving read access time in a memory. It should be understood, however, that embodiments of the invention are not limited to these or any other particular circuit configurations. Rather, embodiments of the invention are more broadly related to techniques for sensing data in a memory in such a manner that read access time is reduced, without concern for whether the memory is embedded or standalone. In this regard, embodiments of the invention provide a read assist scheme that beneficially reduces memory cycle time in a variety of memory arrangements and types, such as, for example, random access memory (RAM), static random access memory (SRAM), read-only memory (ROM), content addressable memory (CAM), flash memory, memory caches, register files, port buffer memories, and the like. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| CAM | Content addressable memory |
| SRAM | Static random access memory |
| RAM | Random access memory |
| ROM | Read-only memory |
| MISFET | Metal-insulator-semiconductor field-effect transistor |
| MOSFET | Metal-oxide-semiconductor field-effect transistor |
| NFET | N-channel field-effect transistor |
| NMOS | N-channel metal-oxide-semiconductor |
| PFET | P-channel field-effect transistor |
| PMOS | P-channel metal-oxide-semiconductor |
| CMOS | Complementary metal-oxide-semiconductor |
| MOS | Metal-oxide-semiconductor |
| BJT | Bipolar junction transistor |
| 6T | Six-transistor |
| S/A | Sense amplifier |
| I/O | Input/output |
| PVT | Process, supply voltage and/or temperature |
| W/L | Width-to-length |
| IC | Integrated circuit |

Throughout the description herein, the term MISFET is intended to be construed broadly and to encompass any type of metal-insulator-semiconductor field-effect transistor. The term MISFET is, for example, intended to encompass semiconductor field-effect transistors that utilize an oxide material as their gate dielectric (i.e., metal-oxide-semiconductor field-effect transistors (MOSFETs)), as well as those that do not. In addition, despite a reference to the term "metal" in the acronym MISFET, the term MISFET is also intended to encompass semiconductor field-effect transistors wherein the gate is formed from a non-metal, such as, for instance, polysilicon.

Although embodiments of the invention described herein may be implemented using p-channel MISFETs (hereinafter called "PFETs" or "PMOS" devices) and/or n-channel MISFETs (hereinafter called "NFETs" or "NMOS" devices), as may be formed using a complementary metal-oxide-semiconductor (CMOS) fabrication process, it is to be appreciated that embodiments of the invention are not limited to such transistor devices and/or such a fabrication process, and that other suitable devices, such as, for example, bipolar junction transistors (BJTs), FinFETs, etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

FIG. 1 is a schematic diagram depicting at least a portion of an exemplary memory circuit 100 in which embodiments of the invention can be implemented. Memory circuit 100 comprises a plurality of memory cells 102. The memory cells 102 are organized as an array 104 (e.g., columns and rows) including corresponding word lines (WL) and pairs of complementary bit lines (BL/BLN) coupled to the memory cells for accessing the cells (e.g., reading and writing). Although embodiments of the invention are not limited to any particular type or organization of memory cells, each of the memory cells 102 in memory array 104 is depicted, by way of illustration only, as comprising a six-transistor (6T) SRAM cell. It is to be appreciated, however, that embodiments of the invention are not limited to 6T SRAM cells.

In this illustrative embodiment, memory circuit 100 includes n word lines and m pairs of complementary bit lines, where m and n are integers. Embodiments of the invention are not limited to any particular values for m and n; moreover, m and n may be the same value. Furthermore, although the word lines are arranged in rows (i.e., horizontally) and the bit lines are arranged in columns (i.e., vertically), other arrangements are similarly contemplated according to alternative embodiments. Each of the memory cells 102 in the memory array 104 is arranged such that it is coupled with a unique combination of a word line and a pair of complementary bit lines.

Memory circuit 100 further includes a row decoder, X_SEL 106, corresponding row driver circuitry 108 coupled with the row decoder, a column decoder, Y_SEL 110, and one or more sense amplifiers (S/A) 112 coupled with the column decoder. In the illustrative memory circuit 100, X sense amplifiers are shown, where X is an integer. The number of sense amplifiers X employed in the memory circuit 100 will typically be a function of a word length (e.g., 32 or 64 bits) of the memory circuit, although it is to be appreciated that embodiments of the invention are not limited to any specific number of sense amplifiers. An output of each of the sense amplifiers 112 is supplied to input/output (I/O) logic circuitry 114. I/O logic circuitry 114 is essentially operative as an interface between the sense amplifiers 112 and circuitry residing externally to memory circuit 100.

A predecoder and controller circuit 116, or alternative controller, is coupled with row decoder 106, row driver circuitry 108, column decoder 110 and sense amplifiers 112. Predecoder and controller circuit 116 is operative to receive, as inputs thereto, a first control signal, which in this embodiment is an address signal (Addr_in), and a second control signal, which in this embodiment is a data or command signal (Cmd_in), and to generate a plurality of output control signals for accessing one or more selected memory cells 102 in the memory array 104 as a function of the input control signals.

Read access time is a critical timing parameter that limits the cycle time of the memory. As previously stated, read access time is often determined as a sum of the time to assert an enable signal on a selected word line ($t_{WL}$), the time to discharge a corresponding bit line ($t_{BL\_DIS}$), the time to sense a bit line signal developed on the bit line ($t_{SEN}$), and the time to transfer data indicative of the sensed bit line signal to a read output port of the memory ($t_{TRANS}$). Since memory cycle time is directly related to read access time, by reducing one or more read access time components (e.g., $t_{WL}$, $t_{BL\_DIS}$, $t_{SEN}$, and/or $t_{TRANS}$), memory cycle time will also be beneficially reduced. Embodiments of the invention focus primarily on reducing bit line discharge time ($t_{BL\_DIS}$).

In a conventional read access scheme, the bit lines and sense amplifier inputs corresponding to a selected memory cell are precharged to a high voltage level (e.g., VDD). Read "0" sensing is achieved by discharging the corresponding bit lines below a switching threshold point of a sense amplifier coupled with the corresponding bit lines to ensure that the sense amplifier accurately resolves and digitizes the signal developed on the bit lines, which is indicative of a logic state of the selected memory cell being read. The time it takes for the signal to be developed on the bit lines is a linear function of a read current, $I_{READ}$, in the memory cell. With increased statistical variation and memory usage beyond, for example, 100 Megabits (Mb) per die, to ensure a prescribed manufacturing yield, read access time is signed-off during testing using a memory cell (i.e., bit-cell) with a statistically worst read current $I_{READ\_wc}$ (e.g., worst-case read current which ensures 90-percent yield with 100 Mb/die). Typically, a magnitude of the worst-case read current $I_{READ\_wc}$ is significantly lower than the magnitude of a nominal read current $I_{READ\_nom}$ over a prescribed range of process, supply voltage and/or temperature (PVT) conditions to which the memory is subjected. Due at least in part to use of this degraded read current $I_{READ\_wc}$ associated with the statistically weak bit-cell, the bit lines (e.g., BL/BLN) will take a longer time to discharge below the switching threshold point of the sense amplifier, thereby increasing the read access time significantly (e.g., by about 20 to 30%).

Figure 2:
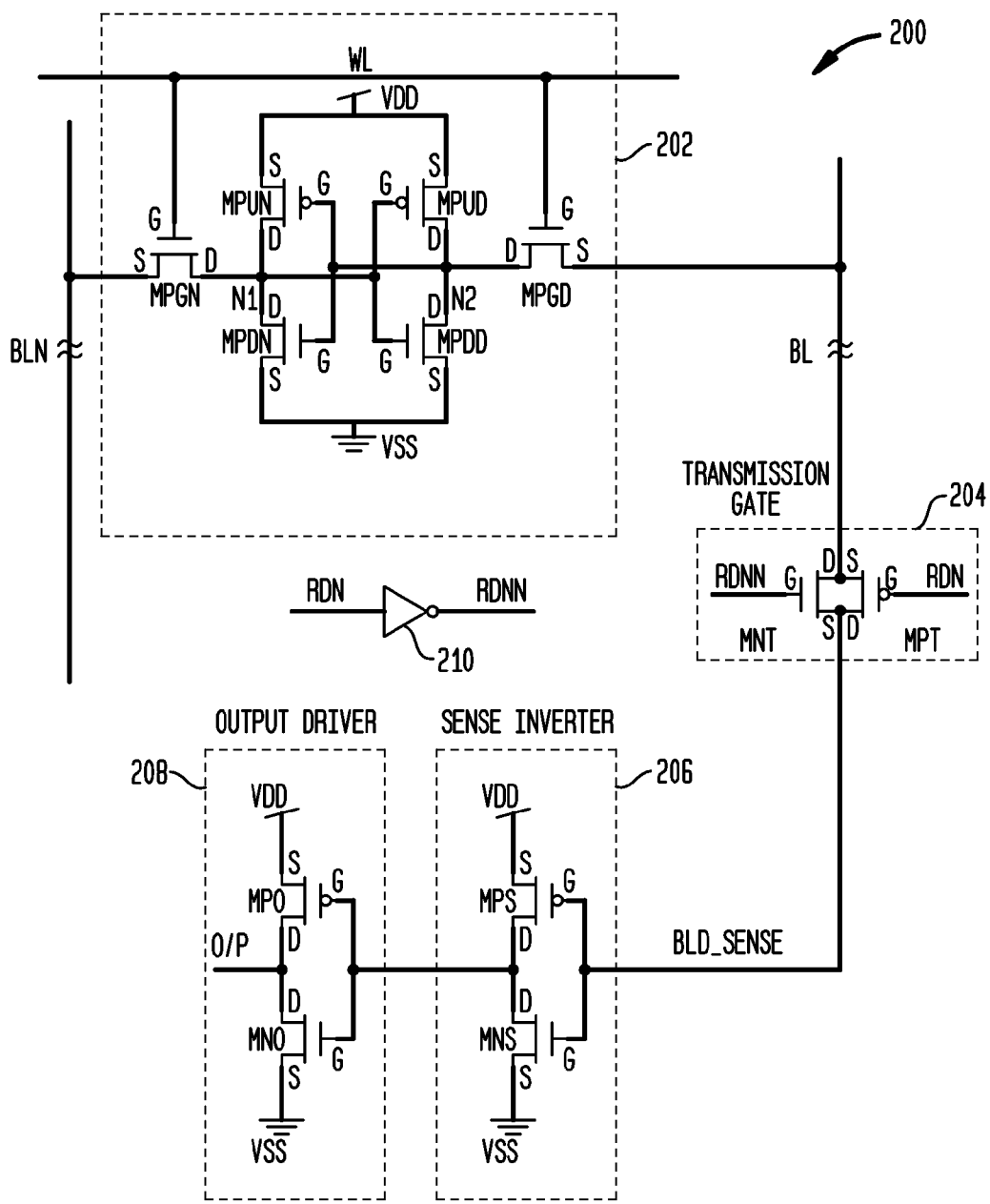
FIG. 2 is a schematic diagram depicting at least a portion of an exemplary memory circuit which can be modified in accordance with embodiments of the invention.

FIG. 2 is a schematic diagram depicting at least a portion of an exemplary memory circuit 200 which can be modified in accordance with embodiments of the invention. The memory circuit 200 includes a plurality of SRAM cells 202, only one of which is shown, and associated read circuitry, including a transmission gate 204, a sense amplifier, implemented in this example as a sense inverter 206, coupled with the transmission gate, and an output driver 208 coupled with the sense inverter. The SRAM cell 202 is coupled with a corresponding word line, WL, and a corresponding pair of complementary bit lines, BL and BLN, for selectively accessing the cell.

The SRAM cell 202 is implemented, in this example, as a 6T cell, including first and second NFETs, MPGN and MPGD, operative as pass gate devices, and a pair of cross-coupled inverters operative as a storage element for the cell. Specifically, a first inverter includes a PFET, MPUN, and an NFET, MPDN, and a second inverter includes a PFET, MPUD, and an NFET, MPDD. A source (S) of MPGN is coupled with bit line BLN, a gate (G) of MPGN is coupled with the word line WL, and a drain (D) of MPGN is connected with drains of MPUN and MPDN at node N1. Sources of MPUN and MPUD are connected with a voltage supply, which is VDD in this example, sources of MPDN and MPDD are connected with a voltage return, which is VSS in this example, gates of MPUN and MPDN are connected with drains of MPUD and MPDD at node N2, and gates of MPUD and MPDD are connected to node N1. A gate of MPGD is coupled with the word line WL, a drain of MPGD is connected with node N2, and a source of MPGD is coupled with bit line BL.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

The transmission gate 204 includes an NFET, MNT, and a PFET, MPT. A drain of MNT and a source of MPT are connected to bit line BL, a gate of MNT is adapted to receive a first control signal, RDNN, a gate of MPT is adapted to receive a second control signal, RDN, which is a logical complement of RDNN, and a source of MNT and a drain of MPT are connected together and generate a signal, BLD_SENSE, which is supplied to the sense inverter 206. The control signal RDNN can be generated, for example, by passing control signal RDN through an inverter 210, although alternative circuitry for generating a logical complement of the signal RDN is similarly contemplated. The signal BLD_SENSE is essentially the voltage developed on the corresponding bit line BL, passed through the transmission gate 204 upon assertion of control signals RDN and RDNN, and is a function of the logical state (i.e., logic "1" or "0") of the SRAM cell 202.

The sense inverter 206 comprises a PFET, MPS, and an NFET, MNS, connected together as a standard inverter. An input of the sense inverter 206 is adapted to receive the signal BLD_SENSE generated by the transmission gate 204. The output driver 208 comprises a PFET, MPO, and an NFET, MNO, connected together as an inverter. An input of the output driver 208 is connected with an output of the sense inverter 206 and is operative to generate an output signal, O/P, at an output of the output driver.

In terms of operation of the memory circuit 200, assume a logic "1" is stored in the SRAM cell 202. In this scenario, node N2 is at a high voltage level (e.g., VDD) and node N1, being a logical complement of node N2, is at a low voltage level (e.g., VSS). Prior to any operation, the corresponding word line WL is set to a low voltage level (i.e., de-asserted), and the corresponding bit lines BL and BLN are pre-charged high (e.g., to VDD). The control signals for activating the transmission gate 204 are initially de-asserted by setting RDN high and setting RDNN low, thereby disabling the transmission gate. The signal BLD_SENSE is initially set high, thus setting the output signal O/P of the output driver 208 high.

During a read operation, the word line WL is asserted by setting WL high, thereby turning on pass gate transistors MPGN and MPGD and discharging either bit line BL or bit line BLN based on the data stored in the SRAM cell 202. Since, in this example, a logic "1" is stored in the SRAM cell 202 (i.e., node N1 is at VSS and node N2 is at VDD), bit line BLN will begin discharging through MPGN and MPDN, and bit line BL will remain high. The transmission gate 204 is turned on by asserting signals RDN and RDNN (e.g., RDN is set low and RDNN is set high). By activating the transmission gate 204, signal BLD_SENSE will be substantially equal to the voltage developed on bit line BL. Recall that prior to the read operation, signal BLD_SENSE is assumed to be set high. Since bit line BL remains high during the read "1" operation, signal BLD_SENSE will also remain high (e.g., VDD), and thus the output signal O/P generated by the output driver 208 remains at VDD. Consequently, reading a logic "1" from the SRAM cell 202 in this scenario does not perceptibly define the read access time in the memory circuit 200.

Alternatively, consider the case where a logic "0" is stored in the SRAM cell 202. In this scenario, node N2 is at VSS and node N1 is at VDD. During the read operation, the word line WL is asserted high, thereby turning on pass gate transistors MPGN and MPGD and discharging bit line BL through MPGD and MPDD with current $I_{READ}$. Here, the current $I_{READ}$ may be a statistically worst read current $I_{READ\_wc}$ (e.g., worst-case read current which ensures about 90-percent yield with 100 Mb/die). As previously stated, a magnitude of the worst-case read current, $I_{READ\_wc}$, is typically lower than the magnitude of a nominal read current, $I_{READ\_nom}$, over a prescribed range of PVT conditions to which the memory is subjected. Bit line BLN will remain high since node N1, to which bit line BLN is connected through MPGN, is also at VDD. The transmission gate 204, controlled by signals RDN and RDNN, is activated when the word line WL is activated, allowing the signal BLD_SENSE to follow the voltage developed on the bit line BL.

To correctly sense the data from the SRAM cell 202, the corresponding bit line BL, and thus signal BLD_SENSE, should discharge below a prescribed threshold level, which in this embodiment is equal to a trip point of the sense inverter, $V_{TPI}$. The read access time ($t_{ACCESS}$), from assertion of the word line WL to generation of a valid output signal O/P, is determined as a sum of the bit line BL discharge rate with current $I_{READ}$ from VDD to $V_{TPI}$ ($t_{BL\_dt\_VDD\text{-}VTPI}$), the delay through the transmission gate 204 ($t_{BL\_bld\_sense\_delay}$), the sense inverter 206 delay ($t_{sense\_inverter\_delay}$), and the output driver 208 delay ($t_{output\_driver\_delay}$). Thus, access time for the memory circuit 200 can be expressed as follows:

$$t_{ACCESS} = t_{BL\_dt\_VDD\text{-}VTPI} + t_{BL\_bld\_sense\_delay} + t_{sense\_inverter\_delay} + t_{output\_driver\_delay}. \quad (1)$$

Consequently, the read "0" operation, in this example, primarily defines the read access time as given above.

Figure 3:
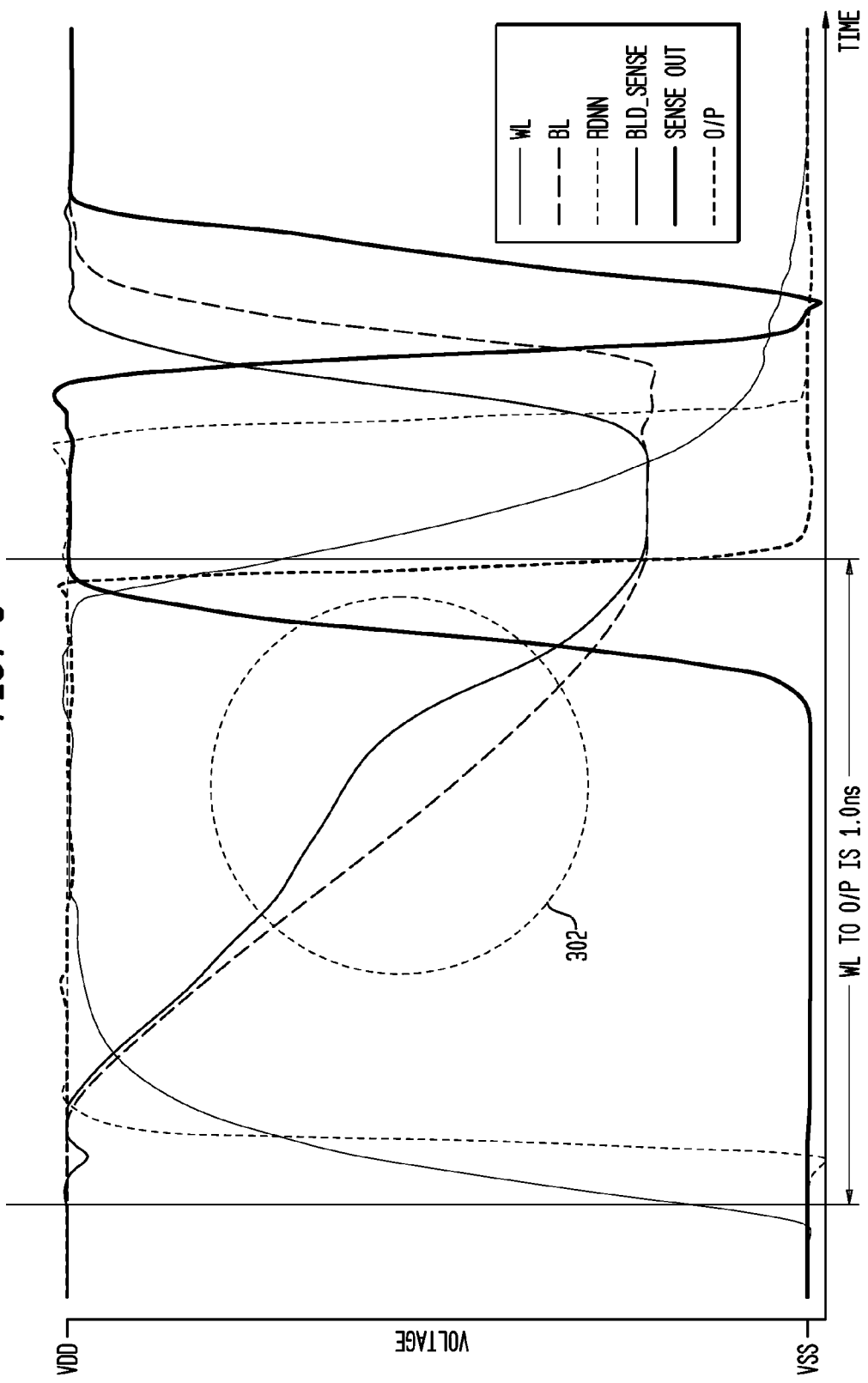
FIG. 3 is a graphical view depicting exemplary waveforms of certain signals in the illustrative memory circuit shown in FIG. 2 during a read "0" operation.

FIG. 3 is a graphical view depicting exemplary waveforms of certain signals in the illustrative memory circuit 200 shown in FIG. 2 during a read "0" operation. Specifically, FIG. 3 depicts word line signal WL, bit line signal BL, transmission gate enable signal, RDNN in this example, signal BLD_SENSE generated at the output of the transmission gate 204 (FIG. 2), an output signal, SENSE OUT, generated at the output of the sense inverter 206, and output signal O/P generated at the output of output driver 208 (FIG. 2). With reference to FIG. 3, in this example, signal BLD_SENSE does not linearly follow the bit line signal BL, as indicated by the "bump" 302 on the BLD_SENSE signal. This is due at least in part to a delay between BL and BLD_SENSE attributable primarily to a delay through the transmission gate 204 (FIG. 2), which is typically greater than a normal inverter delay. This nonlinearity in the BLD_SENSE signal increases the total access time from assertion of the word line signal WL to generation of a valid output signal O/P, which in this example is about 1.0 nanoseconds (ns).

One known solution to speed up the read access time in the memory circuit 200 is to increase the read current $I_{READ}$ by connecting a higher supply voltage to a selected column during the read operation. This solution, however, requires the addition of an on-chip power supply and corresponding I/O pin and is therefore not cost efficient, particularly from an embedded memory perspective. Other known solutions for decreasing the read access time involve reducing the number of rows per bank and increasing the number of local I/O lines, increasing the read current $I_{READ}$ by increasing a drive strength (e.g., channel width to channel length ratio) and/or number of pass gate and pull-down devices in each SRAM cell, and reducing bit line capacitance by spacing the bit lines (e.g., metal used to form the bit line connections) with other signal lines. Each of these solutions, however, comes at a cost of increased die area and/or overhead, and is therefore undesirable.

Embodiments of the invention provide a mechanism for reducing read access time in a memory circuit. In an illustrative embodiment, bit lines in the memory circuit are precharged to a high voltage level (e.g., VDD), and sense amplifier inputs are precharged to a low voltage level (e.g., VSS). During both read "0" and read "1" operations, the scheme according to embodiments of the invention does not rely on a complete bit line discharge. Rather, the bit lines are only discharged to a prescribed voltage (e.g., VDD/2) before triggering a sense amplifier in the memory circuit. In this manner, read access time is reduced by about 30 percent compared to conventional VDD precharged sensing schemes.

Figure 4:
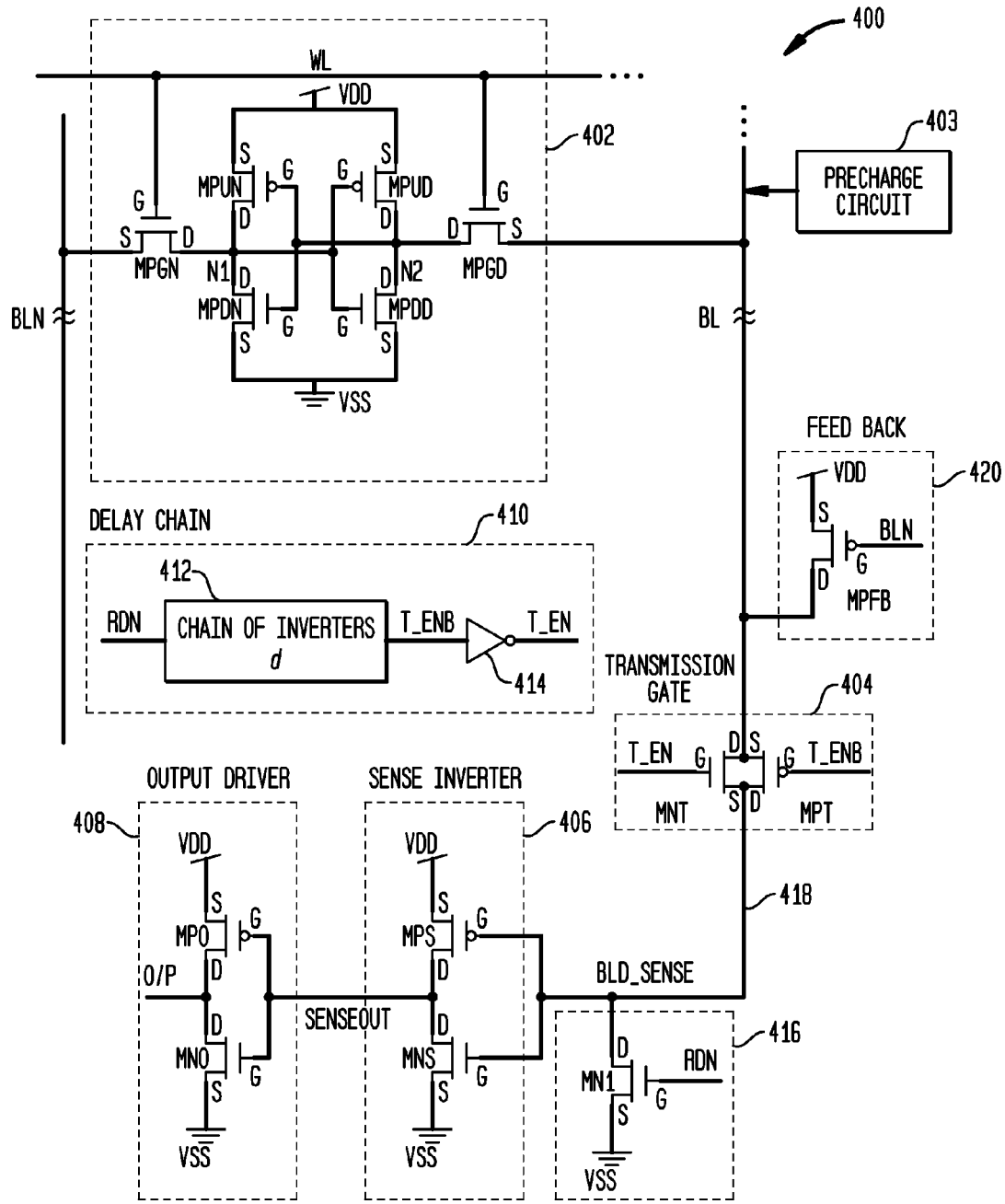
FIG. 4 is a schematic diagram depicting at least a portion of an exemplary memory circuit 400, according to an embodiment of the invention.

FIG. 4 is a schematic diagram depicting at least a portion of an exemplary memory circuit 400, according to an embodiment of the invention. The memory circuit 400 includes a plurality of SRAM cells 402, only one of which is shown, a precharge circuit 403, and associated read circuitry, including a transmission gate 404, a sense amplifier, implemented in this example as a sense inverter 406, coupled with the transmission gate, and an output driver 408 coupled with the sense amplifier. The SRAM cell 402 is coupled with a corresponding word line, WL, and a corresponding pair of complementary bit lines, BL and BLN, for selectively accessing the cell.

The SRAM cell 402 is implemented, in this example, as a 6T cell, which is essentially the same as the SRAM cell 202 shown in FIG. 2, although embodiments of the invention are not limited to any specific type of memory cell employed. More particularly, SRAM cell 402 includes first and second NFETs, MPGN and MPGD, operative as pass gates, and a pair of cross-coupled inverters operative as a storage element for the cell. Specifically, a first inverter includes a PFET, MPUN, and an NFET, MPDN, and a second inverter includes a PFET, MPUD, and an NFET, MPDD. A source of MPGN is coupled with bit line BLN, a gate of MPGN is coupled with the word line WL, and a drain of MPGN is connected with drains of MPUN and MPDN at node N1. Sources of MPUN and MPUD are connected with a voltage supply, which is VDD in this example, sources of MPDN and MPDD are connected with a voltage return, which is VSS in this example, gates of MPUN and MPDN are connected with drains of MPUD and MPDD at node N2, and gates of MPUD and MPDD are connected to node N1. A gate of MPGD is coupled with the word line WL, a drain of MPGD is connected with node N2, and a source of MPGD is coupled with bit line BL.

The precharge circuit 403 is coupled with at least the bit lines BL and BLN and is operative to set the bit lines to prescribed voltage levels during a precharge phase of operation in which no access to the memory cells (e.g., via a read or write operation) occurs. For example, according to one embodiment, the precharge circuit 403 includes a controller (not explicitly shown) for detecting a mode of operation of the memory circuit 400 and for setting the bit lines to VDD, or an alternative voltage, during the precharge phase. Once access to a given memory cell is requested, the precharge circuit 403 is disabled, releasing the corresponding bit lines for use during a read operation to sense the data stored in the selected memory cell, or during the write operation to supply data to be written to the selected memory cell.

The transmission gate 404 includes an NFET, MNT, and a PFET, MPT. A drain of MNT and a source of MPT are connected to bit line BL, a gate of MNT is adapted to receive a first control signal, T_EN, which is an enable signal, a gate of MPT is adapted to receive a second control signal, T_ENB, which is a logical complement of enable signal T_EN, and a source of MNT and a drain of MPT are connected together and generate a signal, BLD_SENSE, which is supplied to the sense inverter 406. The signal BLD_SENSE generated at the drain of MPT is essentially the voltage developed on the corresponding bit line BL, passed through the transmission gate 404 after assertion of control signals T_EN and T_ENB, and is therefore a function of the logical state (i.e., logic "1" or "0") stored in the SRAM cell 402.

The sense inverter 406 comprises a PFET, MPS, and an NFET, MNS, connected together as a standard inverter, for example in a manner consistent with the sense inverter 206 shown in FIG. 2. An input of the sense inverter 406 is adapted to receive the signal BLD_SENSE generated by the transmission gate 404. The output driver 408 comprises a PFET, MPO, and an NFET, MNO, connected together as an inverter in a manner consistent with the output driver 208 shown in FIG. 2. An input to the output driver 408 is connected with an output of the sense inverter 406 for receiving a sense signal, SENSE-OUT, generated by the sense inverter, and is operative to generate an output signal, O/P, at an output of the output driver.

The memory circuit 400 further includes a delay circuit 410 operative to generate the transmission gate enable signals T_EN and T_ENB. In this embodiment, the delay circuit 410 comprises a delay chain of inverters 412, or an alternative delay element, which is operative to receive a read enable signal, RDN, and to generate the transmission gate enable signal T_ENB as a delayed version of the RDN signal. The delay chain 412 has a prescribed delay, d, associated therewith which can be controlled as a function of, for example, a number and/or drive strength of inverters forming the delay chain, as will become apparent to those skilled in the art. The signal T_ENB is then passed through an inverter 414, or alternative inversion element, to generate the signal T_EN as a logical complement of T_ENB.

The read enable signal RDN is also used to control a sense input precharge circuit 416 coupled with an input connection 418 to the sense inverter 406. In this embodiment, the sense input precharge circuit 416 includes an NFET, MN1, having a drain connected with the sense inverter input connection 418, a source adapted for connection with VSS, and a gate adapted to receive the read enable signal RDN. Thus, in terms of function, precharge circuit 416 operates to effectively discharge the input connection 418 to VSS, in this embodiment. It is to be appreciated, however, that alternative precharge circuit arrangements and precharge voltage levels are similarly contemplated, in accordance with other embodiments. Moreover, although depicted as separate functional circuits or blocks in the memory circuit 400, the sense input precharge circuit 416 may be incorporated with the precharge circuit 403, according to embodiments of the invention, to form a single block which integrates the functions of both precharge circuits.

When the read enable signal RDN is at a high voltage level indicative of a de-asserted state, MN1 in the sense input precharge circuit 416 will be turned on, thereby pulling the sense inverter input connection 418 down to VSS. The transmission gate will also be disabled when RDN is high (with T_ENB high and T_EN low), thereby allowing the sense input connection 418 to be defined by the sense input precharge circuit 416. Upon assertion of the read enable signal RDN (e.g., when RDN is at a low voltage level), MN1 will turn off, thereby allowing the sense inverter input connection 418 to float, since activation of the transmission gate 404 will be delayed by the delay circuit 410. The amount of time the input connection 418 is allowed to float will primarily be a function of the delay d associated with the delay chain 412.

Memory circuit 400 further includes a feedback circuit 420 connected with at least one of the complementary bit lines coupled with the corresponding sense inverter 406. In this embodiment, the feedback circuit 420 is connected with bit line BL. In other embodiments, feedback circuit 420 may be omitted. The feedback circuit 420, in this embodiment, comprises a PFET, MPFB, having a source adapted for connection with VDD, a drain connected with bit line BL, and a gate connected with the complementary bit line BLN. Alternative feedback circuit arrangements are similarly contemplated by other embodiments of the invention. As will be described in further detail below, the feedback circuit 420 is operative during a read "1" operation to provide feedback which creates a static conducting path to the sense inverter input to hold the bit line BL at its precharged voltage level.

In terms of operation of the memory circuit 400, during a read "0" operation, the sense inverter 406 senses a logic "0" by default due to the sense inverter input connection 418 being precharged (or "pre-discharged" in this embodiment) to VSS. During a read "1" operation, the signal on the bit line BL develops through charge coupling, assisted by the conditional feedback transistor MPFB in the feedback circuit 420 coupled to the bit line BL, until an adequate signal level is generated on the sense inverter input connection 418 to trigger the sense inverter 406.

More particularly, by way of example only, consider the case where a logic "1" is initially stored in the SRAM cell 402. In this case, node N2 will be at VDD and node N1 will be at VSS, indicative of the logic "1" state. Prior to any access operation (e.g., memory read), the word line WL is set to a low voltage level (e.g., VSS) indicative of a de-asserted state, the bit lines BL and BLN are precharged to a high voltage level (e.g., VDD), and the read enable signal RDN is set to a high voltage level indicative of a de-asserted state. The transmission gate 404 is disabled (i.e., MNT and MPT are turned off), since RDN is set high, and the sense inverter input connection 418 is precharged to a low voltage level through activation of the precharge circuit 416. The output signal O/P is initially set to a low voltage level.

During a read "1" operation, a selected word line WL is activated (e.g., set high) turning on pass gates MPGN and MPGD. With MPGN and MPGD turned on, the charged stored in the storage element of the selected SRAM cell 402 (at nodes N1 and N2) is transferred to the corresponding bit lines. Thus, the complementary bit line BLN, which was precharged high, will discharge through the static conducting path enabled through MPGN and MPDN. The discharge rate of bit line BLN will be a function of the read current $I_{READ}$, determined at least in part by a drive strength of transistors MPGN and MPDN. As previously stated, drive strength of an MOS device is controlled as a function of a ratio of the channel width to channel length of the device. Bit line BL, which was also precharged high, will remain high since no discharge path to VSS is enabled in SRAM cell 402 during the read "1" operation.

The read enable signal RDN is asserted low substantially concurrently with the word line WL being asserted high. When RDN goes low, transistor MN1 in the precharge circuit 416 turns off, thereby releasing the sense inverter input connection 418. A prescribed delay d after RDN goes low, the transmission gate enable signals T_ENB and T_EN generated by the delay circuit 410 are asserted (i.e., T_ENB goes low and T_EN goes high), which turns on transistors MNT and MPT in the transmission gate 404. The delay circuit 410 is operative to generate the transmission gate enable signals T_EN and T_ENB in such a manner that the transmission gate 404 is turned on when the bit line BLN has discharged to a prescribed voltage level, which is about (VDD−VSS)/2, or, assuming VSS=0, VDD/2, in this embodiment.

Before the transmission gate 404 is turned on, the signal BLD_SENSE on the sense inverter input connection 418 will remain substantially at its precharged level, which is VSS in this embodiment. Once the transmission gate 404 is turned on, the signal BLD_SENSE will substantially follow bit line BL, which remains at its precharged high level. When BLD_SENSE rises to at least a switching threshold level of the sense inverter 406, the sense inverter will switch state and generate a low output signal SENSEOUT. With signal SENSEOUT at a low level, the output signal O/P generated by output driver 408 will be driven to a high level. Concurrently, when bit line BLN discharges to at least about a PFET threshold voltage below VDD, transistor MPFB in the feedback circuit 420 will turn on to thereby hold bit line BL at VDD. In this manner, the positive feedback generated by the feedback circuit 420 functions essentially as a latch.

The total read access time $t_{ACCESS}$ from assertion of a select signal (selecting a given SRAM cell, or cells, to read) on the word line WL to generation of a valid output signal O/P by the output driver 408 can be determined by a sum of multiple delay components in the memory circuit 400 as follows:

$$t_{ACCESS} = t_{BL\_dt\_VDD-VDD/2} + t_{BL\_bld\_sense\_delay} + t_{sense\_inverter\_delay} + t_{output\_driver\_delay}, \quad (2)$$

where $t_{bl\_dt\_VDD-VDD/2}$ represents the bit line (BLN) discharge rate from VDD to VDD/2 with read current $I_{READ}$, $t_{BL\_bid\_sense\_delay}$ represents a delay through the transmission gate 404, $t_{sense\_inverter\_delay}$ represents a delay through the sense inverter 406, and $t_{output\_driver\_delay}$ represents a delay through the output driver 408. Discharging the bit line from VDD to VDD/2 ensures that an unwanted bump on the BLD_SENSE node does not change the SENSEOUT and O/P signal status momentarily. Comparing equation (2) to equation (1) above for determining access time in the memory circuit 200 shown in FIG. 2, for the same read current $I_{READ}$, the bit line (BLN) in the memory circuit 400 need only discharge to VDD/2, while the bit line (BL) in the memory circuit 200 must discharge to an inverter trip point (i.e., a threshold at which an inverter switches its output logic state) voltage, $V_{TPI}$, above VSS, which is lower than VDD/2. Accordingly, the memory circuit 400 exhibits a reduced bit line discharge rate compared to other approaches, thereby beneficially reducing read access time.

In addition to reducing the bit line discharge rate, the delay through the transmission gate 404 in memory circuit 400 is also reduced compared to the memory circuit 200 depicted in FIG. 2. Recall, that in the memory circuit 200, the input signal BLD_SENSE to the sense inverter 206 does not linearly follow the bit line signal BL. This is evidenced by the bump 302 in the BLD_SENSE signal waveform shown in FIG. 3. This nonlinearity in the BLD_SENSE signal is due primarily to that fact that the delay associated with the transmission gate 206 is greater than a normal inverter delay (e.g., a delay associated with the inverters in the sense inverter 206 and output driver 208). In the memory circuit 400 shown in FIG. 4, however, the BLD_SENSE signal follows the bit line signal BL substantially linearly.

In memory circuit 400, the delay through the transmission gate 404 is actually the delay from enabling the transmission gate 404 (e.g., by assertion of transmission gate enable signals T_EN and T_ENB) to charging of the BLD_SENSE signal to VDD (since bit line BL is held high), which is similar to a normal inverter delay. Thus, total read access time $t_{ACCESS}$ in equation (2) above can be rewritten as follows:

$$t_{ACCESS} = t_{BL\_dt\_VDD-VDD/2} + t_{T\_ENB\_bld\_sense\_delay} + t_{sense\_inverter\_delay} + t_{output\_driver\_delay},$$

where $t_{T\_ENB\_bid\_sense\_delay}$ represents the delay between assertion of the transmission gate enable signals T_EN and T_ENB and the charging of the BLD_SENSE signal to the level of bit line BL; namely, VDD. Here, since the delay through the transmission gate 404 (i.e., $t_{T\_ENB\_bid\_sense\_delay}$) is less than the delay through the transmission gate 204 (i.e., $t_{BL\_bid\_sense\_delay}$), the read access time is further reduced.

Another reduction in read access time achieved by the memory circuit 400 is attributable to the fact that in the memory circuit 200 shown in FIG. 2, the voltage on the input node to the sense amplifier 206 (BLD_SENSE signal) is nonlinear (as illustrated in FIG. 3) as it follows the bit line signal BL, which itself is not ideal due, at least in part, to the worst-case read current $I_{READ}$ defining the access time during a read "0" operation. But in the memory circuit 400, the BLD_SENSE signal present on the sense inverter input connection 418 exhibits a significantly improved voltage ramp characteristic, since the bit line BL is now already precharged to VDD, thereby improving access time during a read "1" operation.

Next, consider the case where a logic "0" is stored in the SRAM cell 402. In this case, node N2 will be at VSS and node N1 will be at VDD, indicative of the stored logic "0" state. Prior to any access operation, as in the case of a read "1" operation, the word line WL is set to a low voltage level (e.g., VSS) indicative of a de-asserted state, the bit lines BL and BLN are precharged to a high voltage level (e.g., VDD), and the read enable signal RDN is set to a high voltage level indicative of a de-asserted state. The transmission gate 404 is therefore disabled (i.e., MNT and MPT are turned off) and the sense inverter input connection 418 is precharged to a low voltage level through activation of the precharge circuit 416. The output signal O/P is initially set to a low voltage level.

During the read "0" operation, a selected word line WL is activated (e.g., set high) turning on pass gates MPGN and MPGD in the corresponding SRAM cell 402. With MPGN and MPGD turned on, the charge stored in the storage element of the selected SRAM cell 402 is transferred to the bit lines BL and BLN. Thus, the complementary bit line BL, which was precharged high, will discharge through the static conducting path enabled through MPGD and MPDD. The discharge rate of bit line BL will be a function of the read current $I_{READ}$, determined at least in part by a drive strength (e.g., channel width-to-length ratio) of transistors MPGD and MPDD. Bit line BLN, which was also precharged high, will remain high, since node N1, to which BLN is coupled through pass gate MPGN, is high.

The read enable signal RDN is asserted low substantially concurrently with the word line WL being asserted high. When RDN goes low, transistor MN1 in the precharge circuit 416 turns off, thereby releasing the sense inverter input connection 418. A prescribed delay d after RDN goes low, the transmission gate enable signals T_ENB and T_EN generated by the delay circuit 410 are asserted (i.e., T_ENB goes low and T_EN goes high), which turns on transistors MNT and MPT in the transmission gate 404. As in the read "1" case, the delay circuit 410 is operative to generate the transmission gate enable signals T_EN and T_ENB in such a manner that the transmission gate 404 is turned on when the bit line BL has discharged to a prescribed level, which is about (VDD−VSS)/2, or, assuming VSS=0, VDD/2, in this embodiment. Before the transmission gate 404 is turned on, the signal BLD_SENSE on the sense inverter input connection 418 will remain substantially at its precharged level, which is VSS in this embodiment.

Once the transmission gate 404 is turned on, the signal BLD_SENSE will substantially follow bit line BL, which will be at a voltage level of about VDD/2 when the transmission gate is first turned on. Thus, BLD_SENSE, which is initially precharged to VSS, will rise to a voltage of about VDD/2, and then begin falling as the bit line BL continues to further discharge. When BLD_SENSE rises to about VDD/2, the NFET MNS in the sense inverter 406 will turn on. At a voltage of VDD/2, the PFET MPS in the sense inverter 406 will also remain turned on, assuming VDD/2 is at a level sufficiently below VDD−$V_{TP}$, where $V_{TP}$ is a PFET threshold voltage. Because the NFET MNS may or may not turn on as strongly as the PFET MPS in the sense inverter 406, the signal SENSEOUT generated at the output of the sense inverter may or may not be driven to a logic "0" state (e.g., VSS). Regardless of the state of the sense inverter 406, once the bit line BL, and therefore the BLD_SENSE signal, falls to below an NFET threshold voltage, $V_{TN}$, MNS will turn off and MPS will turn on, thereby driving SENSEOUT to a logic "1" state (e.g., VDD), thereby driving the output signal O/P to a logic "0" state.

Although there may be a tendency for unwanted or unpredictable transitions in the output signal generated by the sense inverter 406 as noted above, these unwanted transitions can be reduced or eliminated by controlling (i.e., "tuning") one or more characteristics, including, for example, drive strength, of the inverters in the sense inverter 406. In accordance with embodiments of the invention, "tuning" of the inverters may comprise controlling a drive strength (e.g., number of devices and/or device channel width-to-length (W/L) ratio) of the NFET device relative to the corresponding PFET device in each of the given inverters. For example, in one embodiment, the drive strength of NFET MNS in the sense inverter 406 is made smaller than the drive strength of PFET MPS, so that when the BLD_SENSE signal is at about VDD/2, the SENSEOUT signal is always driven to a logic "1" state (i.e., the PFET device is adapted to overdrive the NFET device for all levels of the BLD_SENSE signal during the read "0" case). As previously explained, the drive strength of an MOS device can be increased, for example, by adding multiple devices in parallel with one another and/or by increasing a W/L ratio of the device. Likewise, drive strength can be decreased by reducing the number of parallel devices and/or by decreasing a W/L ratio of the device, as will become apparent to those skilled in the art.

The rate at which the BLD_SENSE signal follows the bit line BL is dependent, at least in part, on characteristics of the NFET MNT in the transmission gate 404. Thus, by controlling (e.g., "tuning") one or more characteristics of MNT, including, for example, drive strength, the BLD_SENSE signal can be limited to about an NFET threshold voltage $V_{TN}$. By limiting the rise of the BLD_SENSE signal to about $V_{TN}$, the NFET MNS will remain turned off, or at least only weakly turned on relative to the PFET MPS, during the read "0" operation.

It is to be appreciated that during a precharge phase, prior to assertion of the select signal on the word line WL, the output signal O/P will already be at a logic "0" level. Consequently, the read "0" operation does not define the read access timing in the memory circuit 400. Moreover, since the bit line BLN remains at its precharged level (VDD), the feedback circuit 420 coupled with bit line BL remains disabled during the read "0" operation (i.e., MPFB remains turned off).

FIG. 5 is a graphical view depicting exemplary waveforms of certain signals in the illustrative memory circuit 400 shown in FIG. 4 during a read "1" operation. The x-axis is relative time and the y-axis is relative voltage. Specifically, FIG. 5 depicts word line signal WL, bit line signal BL, transmission gate enable signal T_EN (which is a delayed and inverted version of the read control signal RDN), and signal BLD_SENSE generated at the output of the transmission gate 404 (FIG. 4). As apparent from FIG. 5, signal BLD_SENSE linearly follows the bit line signal BL. The delay circuit 410 in the memory circuit 400 depicted in FIG. 4 is configured so that the transmission gate enable signal T_EN turns on the transmission gate 404 only after bit line BL has discharged to below a "low" switching point of the sense inverter 406, which prevents unwanted charge coupling between bit line BL and the BLD_SENSE signal, and thus the previously sensed logic "0" data remains unaffected. This eliminates the sense inverter delay component during a read "0" operation and thereby enhances access time significantly compared to standard approaches. The total access time from assertion of the word line signal WL to generation of a valid output signal O/P in this example is about 0.7 ns; an improvement of about 30 percent over the access time exhibited by the memory circuit 200 shown in FIG. 2.

At least a portion of the techniques of embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

An integrated circuit in accordance with embodiments of the invention can be employed in essentially any application and/or electronic system in which memories are utilized, either stand-alone or embedded. Suitable systems for implementing embodiments of the invention may include, but are not limited, to interface devices (e.g., interface networks, high-speed memory interfaces (e.g., DDR3, DDR4), etc.), personal computers, communication networks, electronic instruments (e.g., automated test equipment (ATE), measurement equipment, etc.), etc. Systems incorporating such integrated circuits are considered part of this invention. Given the teachings of embodiments of the invention provided herein, one of ordinary skill in the art will be able to contemplate other implementations and applications of embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A read circuit for use in a memory including a plurality of memory cells, at least one word line and a plurality of bit lines coupled with the memory cells for selectively accessing the memory cells, and at least one sense circuit for reading data stored in a selected one of the memory cells, the read circuit comprising:
   a precharge circuit coupled with at least a subset of the bit lines and the sense circuit, the precharge circuit being operative to receive at least a first control signal, and being operative during a first mode to set the bit lines to a first voltage level and to set an input to the sense circuit to a second voltage level; and
   a transmission gate operative to selectively connect a given one of the bit lines with the sense circuit during a second mode as a function of at least a second control signal, the second control signal being a delayed version of the first control signal, such that when reading a first logic level from the selected one of the memory cells, when the input of the sense circuit is connected with the given one of the bit lines, the given one of the bit lines has discharged to at least a third voltage, the third voltage being between the first and second voltage levels, thereby reducing a read access time in the memory.

2. The read circuit of claim 1, further comprising a delay circuit operative to receive the first control signal and to generate the second control signal which is delayed from the first control signal by a prescribed delay, the prescribed delay being configured such that when reading the first logic level from the selected one of the memory cells, activation of the transmission gate is delayed until the given one of the bit lines has discharged to at least the third voltage.

3. The read circuit of claim 2, wherein the delay circuit comprises a plurality of inverters connected together to form a delay chain, the prescribed delay associated with the delay circuit being a function of at least one of a number of inverters in the delay chain and a strength of one or more of the inverters in the delay chain.

4. The read circuit of claim 2, wherein a value of the prescribed delay is configured so that a relationship between activation of the transmission gate relative to discharging of the given one of the bit lines is controlled to ensure that the read access time of the memory is not determined by a time to read the first logic level.

5. The read circuit of claim 1, wherein the third voltage is about halfway between the first and second voltage levels.

6. The read circuit of claim 1, wherein the third voltage is set to a level whereby a charge developed on the input of the sense circuit when reading the first logic level from the selected one of the memory cells does not switch a logic state of an output signal generated by the read circuit.

7. The read circuit of claim 1, further comprising a feedback circuit coupled with at least the given one of the bit lines, the feedback circuit being operative, when reading a second logic level from the selected one of the memory cells, to establish a conducting path to hold the given one of the bit lines at the first voltage level.

8. The read circuit of claim 7, wherein the first logic level is indicative of a logic "0" and the second logic level is indicative of a logic "1."

9. The read circuit of claim 1, wherein the first mode is a precharge mode and the second mode is a read mode.

10. The read circuit of claim 1, wherein the precharge circuit comprises an NFET device having a first source/drain connected with the input to the sense circuit, a second source/drain configured for connection with a voltage source at the second voltage level, and a gate configured to receive the first control signal.

11. The read circuit of claim 1, wherein a discharge rate of the given one of the bit lines is controlled as a function of a drive strength of at least one of a pass gate and a pull-down transistor in the selected one of the memory cells in the memory.

12. The read circuit of claim 1, wherein a voltage developed on the input of the sense circuit substantially linearly tracks a voltage developed on the given one of the bit lines, thereby reducing a delay through the transmission gate.

13. The read circuit of claim 1, wherein at least a portion of the read circuit is fabricated in at least one integrated circuit.

14. A memory circuit, comprising:
   a plurality of memory cells;
   at least one word line and a plurality of bit lines, the word line and bit lines being coupled with the memory cells for selectively accessing the memory cells;
   at least one sense circuit operative to read data stored in a selected one of the memory cells;
   a controller operative to receive, as input control signals, an address signal and a data signal, and to generate a plurality of output control signals for accessing one or more of the plurality of memory cells as a function of the input control signals; and
   a read circuit, the read circuit comprising:
      a precharge circuit coupled with at least a subset of the bit lines and the sense circuit, the precharge circuit being operative to receive at least a first control signal, and being operative during a first mode to set the bit lines to a first voltage level and to set an input to the sense circuit to a second voltage level; and
      a transmission gate operative to selectively connect a given one of the bit lines with the sense circuit during a second mode as a function of at least a second control signal, the second control signal being a delayed version of the first control signal, such that when reading a first logic level from the selected one of the memory cells, when the input of the sense circuit is connected with the given one of the bit lines, the given one of the bit lines is discharged to at least a third voltage, the third voltage being between the first and second voltage levels, thereby reducing a read access time in the memory circuit.

15. The memory circuit of claim 14, wherein the read circuit further comprises a delay circuit operative to receive the first control signal and to generate the second control signal which is delayed from the first control signal by a prescribed delay, the prescribed delay being configured such that when reading the first logic level from the selected one of the memory cells, activation of the transmission gate is delayed until the given one of the bit lines has discharged to at least the third voltage.

16. The memory circuit of claim 15, wherein the delay circuit comprises a plurality of inverters connected together to form a delay chain, the prescribed delay associated with the delay circuit being a function of at least one of a number of inverters in the delay chain and a strength of one or more of the inverters in the delay chain.

17. The memory circuit of claim 15, wherein a value of the prescribed delay is configured so that activation of the transmission gate relative to discharging of the given one of the bit lines is controlled to ensure that the read access time of the memory circuit is not determined by a time to read the first logic level.

18. The memory circuit of claim 14, wherein the third voltage is set to a level whereby a charge developed on the input of the sense circuit when reading the first logic level from the selected one of the memory cells does not switch a logic state of an output signal generated by the read circuit.

19. The memory circuit of claim 14, further comprising a feedback circuit coupled with at least the given one of the bit lines, the feedback circuit being operative, when reading a second logic level from the selected one of the memory cells, to establish a conducting path to hold the given one of the bit lines at the first voltage level.

20. The memory circuit of claim 14, wherein a discharge rate of the given one of the bit lines is controlled as a function of a drive strength of at least one of a pass gate and a pull-down transistor in the selected one of the memory cells in the memory circuit.

21. The memory circuit of claim 14, wherein a voltage developed on the input of the sense circuit substantially linearly tracks a voltage developed on the given one of the bit lines, thereby reducing a delay through the transmission gate.

22. The memory circuit of claim 14, wherein at least a portion of the memory circuit is fabricated in at least one integrated circuit.

* * * * *